(12) United States Patent
Hoefler

(10) Patent No.: US 7,161,822 B2
(45) Date of Patent: Jan. 9, 2007

(54) COMPACT NON-VOLATILE MEMORY ARRAY WITH REDUCED DISTURB

(75) Inventor: Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 18 days.

(21) Appl. No.: 11/068,625

(22) Filed: Feb. 28, 2005

(65) Prior Publication Data

US 2006/0193167 A1   Aug. 31, 2006

(51) Int. Cl.
*G11C 5/06* (2006.01)
(52) U.S. Cl. .................... 365/63; 365/185.05
(58) Field of Classification Search ............ 365/63, 365/185.05, 185.16; 257/296
See application file for complete search history.

(56) References Cited

U.S. PATENT DOCUMENTS

| | | | |
|---|---|---|---|
| 5,789,776 A * | 8/1998 | Lancaster et al. ........... | 257/296 |
| 5,982,669 A * | 11/1999 | Kalnitsky et al. ...... | 365/185.28 |
| 6,414,872 B1 | 7/2002 | Bergemont et al. | |
| 6,678,190 B1 * | 1/2004 | Yang et al. ............ | 365/185.05 |
| 2004/0129985 A1 | 7/2004 | Lee et al. | |

OTHER PUBLICATIONS

Lee, Kung-Hong, "New Single-poly EEPROM with Cell Size down to 8F² for High Density Embedded Nonvolatile Memory Applications", 2003 Symposium on VLSI Technology Digest of Technical Papers, pp. 93-94.

* cited by examiner

*Primary Examiner*—Vu A. Le
(74) *Attorney, Agent, or Firm*—James L. Clingan, Jr.; Robert L. King

(57) ABSTRACT

A non-volatile memory (NVM) array is made of NVM cells that have a floating gate transistor and a select transistor in which the floating gate transistor requires only a single layer of polysilicon. Adjacent cells are arranged so that the floating gates are staggered rather than being in the same line. This results in being able to put the cells closer together because of the reduction of the significance of what is commonly called poly-to-poly spacing. In this case, the termination of one floating gate is not lined-up with the floating gate of the adjacent NVM cell in the same row. Adjacent memory cells in the same column are made to have different configurations from each other which results in the floating gates in adjacent columns not being aligned, thus avoiding the poly-to-poly spacing limitation.

19 Claims, 3 Drawing Sheets

COMPACT NON-VOLATILE MEMORY ARRAY WITH REDUCED DISTURB

FIELD OF THE INVENTION

This invention relates to integrated circuits, and more particularly to integrated circuits having a non-volatile memory array.

BACKGROUND OF THE INVENTION

Non-volatile memory (NVM) has taken a significant role in a variety of applications so that many integrated circuits commonly have at least some non-volatile memory on them. One of the continuing objectives is for that NVM to take up as little space as possible while adding as little manufacturing process complexity as possible. One of the techniques that have developed in order to reduce processing complexity is to have a floating gate NVM cell made from a single layer of polysilicon. This is called a single-poly cell, which is different from that commonly used for NVM. Typically an NVM array uses a floating gate transistor as the NVM cell that has both a floating gate and a control gate, thus requiring two layers of polysilicon in the manufacturing process. Logic on the other hand generally requires only a single layer of polysilicon. Thus, removing the requirement for a second layer of polysilicon for the NVM would often have the effect of simplifying the manufacturing process by requiring only a single layer of polysilicon in making the integrated circuit, a significant simplification of the process.

One of the disadvantages of using the single-poly floating gate transistor for some types of non-volatile storage is that a second transistor, a select transistor, is required for the NVM cell. This has the disadvantageous effect of requiring more area of the integrated circuit for the NVM array.

Thus, there is a need for a single-poly NVM array that requires reduced area.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE INVENTION

In one aspect a non-volatile memory (NVM) array is made of NVM cells that have a floating gate transistor and a select transistor in which the floating gate transistor requires only a single layer of polysilicon. Laterally adjacent cells are arranged so that the floating gates are staggered rather than being in the same line. This results in being able to put the cells closer together because of the reduction of the significance of what is commonly called poly-to-poly spacing. In this case, the termination of one floating gate is not lined-up with the floating gate of the adjacent NVM cell. Thus, the poly-to-poly spacing requirement is not the limitation on how close adjacent NVM cells are together. This is achieved by having a pair of bit lines, that are separately controlled, for each column of NVM cells. The floating gate transistors are staggered in the column as to which of the two bit lines they are directly connected. This also results in reducing the number of NVM cells in half that are subjected to significant program and read disturb problems for any given read or program operation. This is better understood with reference to the drawings and the following description.

Figure 1:
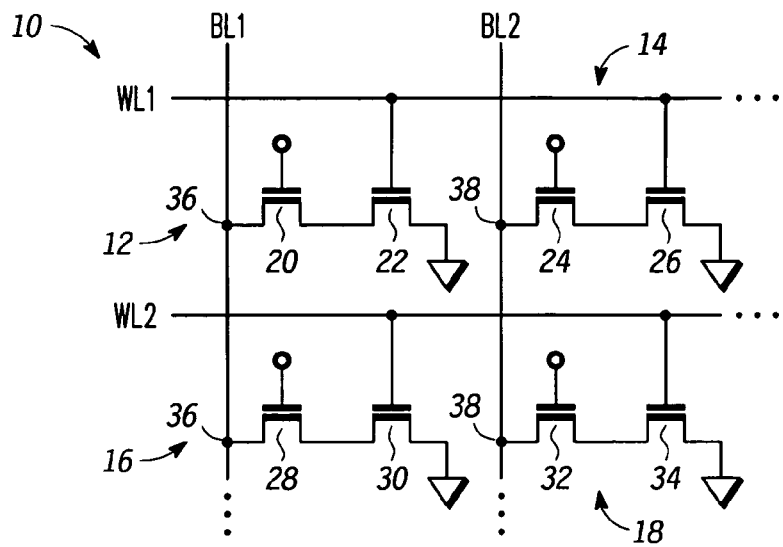
FIG. 1 is a circuit diagram of an NVM array according to the prior art.

Shown in FIG. 1 is a memory array 10 of the prior art comprising memory cells 12, 14, 16, and 18, word lines WL1 and WL2, and bit lines BL1 and BL2. Memory cell 12 comprises a floating gate transistor 20 and select transistor 22. Memory cell 14 comprises a floating gate 24 and a select transistor 26. Memory cell 16 comprises a floating gate transistor 28 and a select gate transistor 30. Memory cell 18 comprises a floating gate transistor 32 and a select gate transistor 34. Floating gate transistors 20, 24, 28, and 32 are single poly floating gate transistors. Transistor 20 has a drain connected to bit line BL1 and a source. The floating gate in the floating gate transistors, as the name implies, are left floating. Transistor 22 has a drain connected to the source of transistor 20, a gate connected to word line WL1, and a source connected to ground. Transistor 24 has a drain connected to bit line BL2 and a source. Transistor 26 has a drain connected to the source of transistor 24, a gate connected to word line WL1, and a source connected to ground. Transistor 28 has a drain connected to bit line BL1 and a source. Transistor 30 has a drain connected to the source of transistor 28, a gate connected to word line WL2, and a source connected to ground. Transistor 32 has a drain connected to bit line BL2 and a source. Transistor 34 has drain connected to the source of transistor 32, a gate connected to word line WL2, and a source connected to ground. It is apparent that a typical memory will have far more memory cells than that shown for NVM 10, which shows simply two rows and two columns. Cells 12 and 14 are considered to be in one row and cells 16 and 18 in another row. Similarly, cells 12 and 16 are considered to be in one column and cells 14 and 18 are in another column. Transistors 20 and 28 contact bit line BL1 at the same contact point 36, and transistors 24 and 32 contact bit line BL2 at the same contact point 36.

Figure 2:
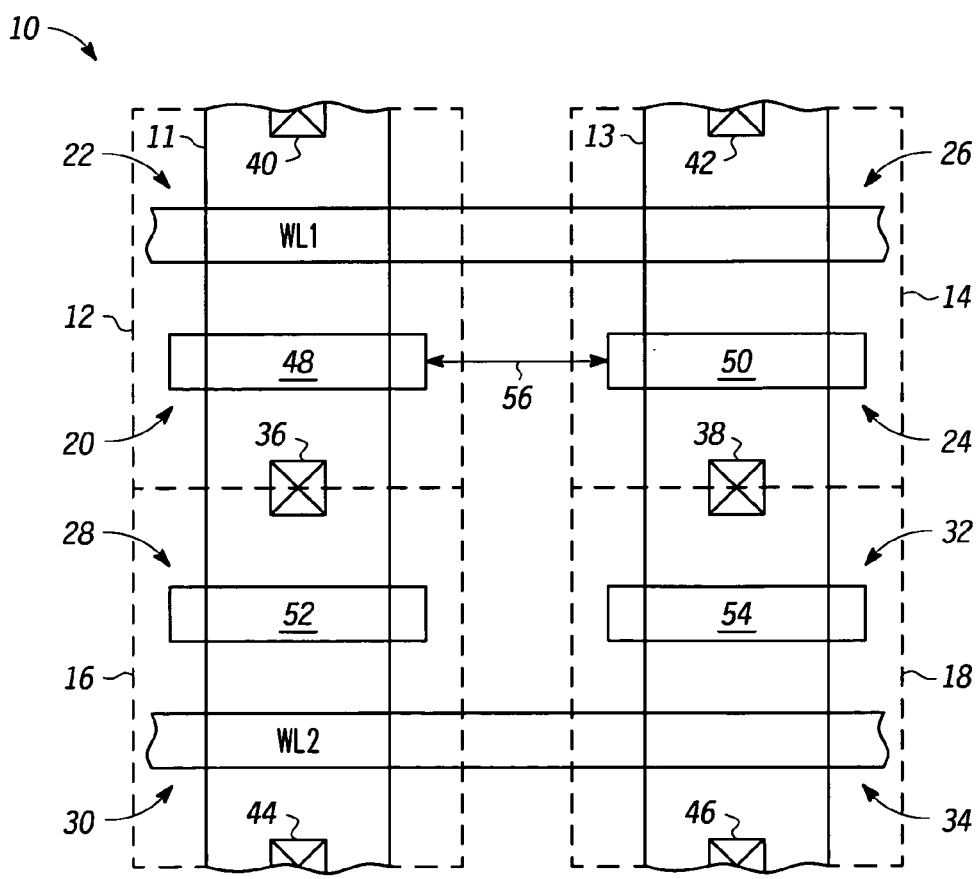
FIG. 2 is a top view of the memory array of FIG. 1.

Shown in FIG. 2 is memory 10 in a layout form. FIG. 2 shows that cells 12 and 16 are in an active area 11 and cells 14 and 18 are in an active area 13. Active areas 11 and 13 are each used to contain a column of memory cells. This also shows that word lines WL1 and WL2 are each continuous polysilicon layers. The cells connected to word line WL1 form one row and cells connected to word line WL2 form another row. Contact 40 provides an electrical contact between the source of transistor 22 and ground. Contact 42 provides an electrical contact between the source of transistor 26 and ground. Contact 44 provides an electrical contact between the source of transistor 30 and ground. Contact 46 provides an electrical contact between the source of transistor 34 and ground. Floating gate transistors 20 and 24 are in the same row and have floating gates 48 and 50, respectively, that are polysilicon. As being parts of adjacent memory cells in the same row, floating gates 48 and 50 are along the same line. There is a distance 56 between floating gates 48 and 50 that controls how close cells 22 and 26 can be to each other. This is the distance between columns.

Distance 56 is the minimum distance that polysilicon layers can be to each other based on the poly-to-poly spacing that is allowed. This distance 56 between floating gates 48 and 50 is limited by the particular manufacturing process being used. For a given manufacturing process, there is a minimum requirement for poly-to-poly spacing, in this case distance 56, that must be followed for all designs using that process.

Figure 3:
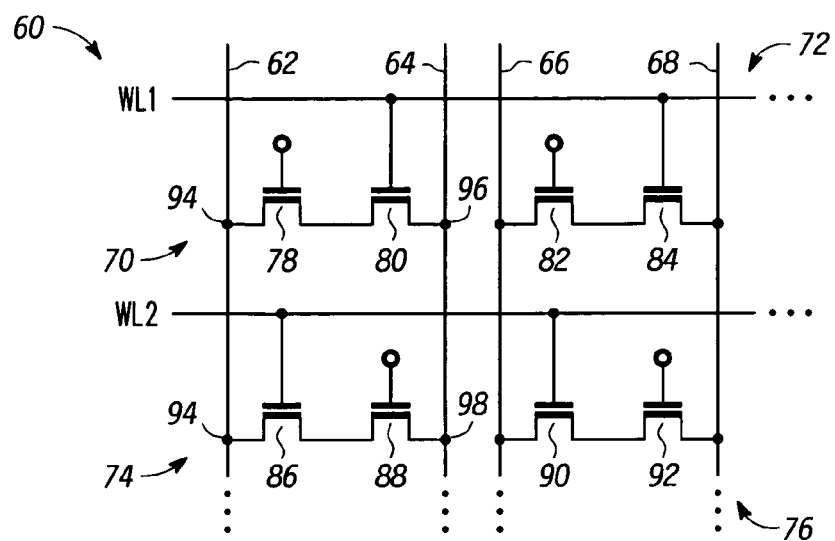
FIG. 3 is a circuit diagram of an NVM array according to an embodiment of the invention.

Shown in FIG. 3 is an NVM array 60 comprising word lines WL1 and WL2, which are analogous to those of array 10 of FIG. 1, bit lines 62, 64, 66, and 68, and memory cells 70, 72, 74, and 76. Bit lines 62 and 64 are a pair of bit lines that define a column. Memory cells 70 and 74 are connected to bit line pair 62–64 and comprise one column. Similarly, memory cells 72 and 76 are connected to bit line pair 66–68 and comprise another column. Memory cells 70 and 72 are connected to word line WL1 and comprise one row. Memory cells 74 and 76 are connected to word line WL2 and comprise another row. Similar to array 10, array 60 comprises two columns and two rows to demonstrate the invention. In practice, a typical memory array would have many more rows and columns. Memory cell 70 comprises a floating gate transistor 78 and a select transistor 80. Memory cell 72 comprises a floating gate transistor 82 and a select transistor 84. Memory cell 74 comprises a select transistor 86 and a floating gate transistor 88. Memory cell 76 comprises a select transistor 90 and floating gate transistor 92. Individual floating gate transistors of array 60 are made in the same way as the floating gate transistors of array 10.

Floating gate transistor 78 has a drain connected to bit line 62 through contact 94 and a source. Select transistor 80 has a drain connected to the source of floating gate transistor 78, a gate connected to word line WL1, and a source connected to bit line 64 through contact 96. Floating gate transistor 82 has a drain connected to bit line 66 and a source. Select transistor 84 has a drain connected to the source of floating gate transistor 82, a gate connected to word line WL1, and a source connected to bit line 68. Select transistor 86 has a source connected to bit line 62, a gate connected to word line WL2, and a drain. Floating gate transistor 88 has a source connected to the drain of select transistor 86 and a drain connected to bit line 64 through a contact 98. Select transistor 90 has a source connected to bit line 66, a gate connected to word line WL2, and a drain. Floating gate transistor 92 has a source connected to the drain of select transistor 90 and a drain connected to bit line 68.

Array 60 thus has an architecture in which each memory cell is connected to a pair of bit lines. When a memory cell is being read, the word line to which it is connected is enabled and the bit line connected to the select transistor is grounded and the bit line connected to the floating gate transistor is used for reading the state of the floating gate transistor of the selected memory cell. For example, to read memory cell 70, word line WL1 is enabled, bit lines 64, 66, and 68 are grounded, and bit line 62 is used for sensing the state of floating gate transistor 78. On the other hand, to read memory cell 74, word line WL2 is enabled, bit lines 62, 66, and 68 are grounded, and bit line 64 is used for sensing. Thus, adjacent memory cells in the same column are arranged oppositely. That is the floating gates in adjacent cells in the same column are connected to different bit lines of the pair of bit lines of that column. Similarly for programming, the bit line that is connected to the floating gate transistor of the selected memory cell is used for applying the programming voltage so that adjacent memory cells in the same column receive the programming voltage on a different bit line of the pair of bit lines for that column. Thus, for any given read or write operation, half of the floating gate transistors in a given column are going to be directly connected to the bit line that is being used the read or the write.

This reduces an undesired effect of the array operation which is commonly called disturb. One case of disturb occurs in a memory array for all memory cells whose drain of the floating gate transistor is connected to a selected bit line, and whose gate of the select transistor is at the same time connected to an unselected word line. Since in the arrangement as shown in FIG. 3, and the layout as will be explained in FIG. 4, the drain of the floating gate transistor of only half of all memory cells in a column is connected to a selected bit line, this disturb affects only half of the memory cells in a given column. Thus, the disturb effect is reduced by one half.

Memory cell 70 with its select transistor having its drain connected to bit line 64 can be considered to have a first type of configuration. Memory cell 74 with its select transistor having its drain connected to a bit line 62 can be considered to have a second configuration. This can be stated as adjacent memory cells in a column have different configurations in that they are connected differently to the bit lines that they have in common. In this example, adjacent memory cells in the same row have the same configuration. Memory cells 70 and 72 each have the drain of their floating gate transistor connected to the left bit line of their pair of bit lines.

In effect adjacent memory cells in a column are symmetric about a line drawn through the center of the column. That is, one cell in a column is a mirror image of an adjacent cell in the same column when the "mirror," the line of symmetry, is placed vertically through the middle of the adjacent cell. This substantially mirrored physical layout results in the desired non-alignment of the floating gates of the adjacent columns. This is further explained by reference to FIG. 4 and the following description thereof.

Figure 4:
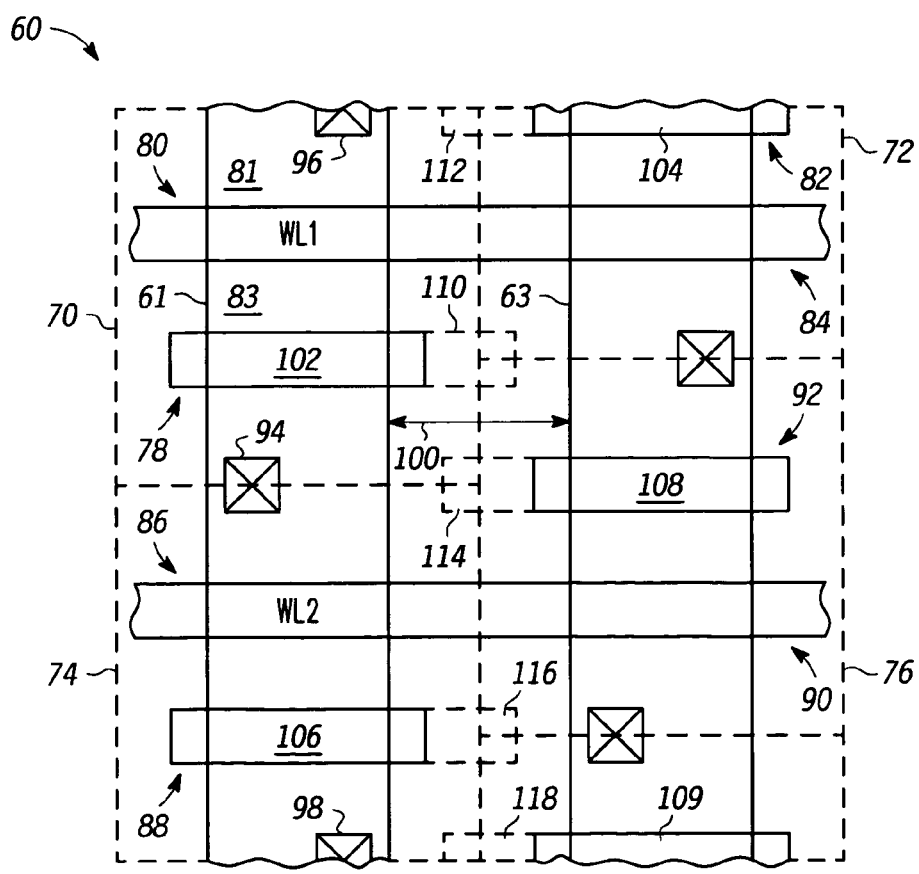
FIG. 4 is a top view of the NVM array of FIG. 3.

Shown in FIG. 4 is array 60 as a physical layout. Memory cells 70 and 74 are in active region 61 and memory cells 72 and 76 are in active region 63. The floating gate of floating gate transistor 78 comprises a polysilicon portion 102, the floating gate of floating gate transistor 82 comprises a polysilicon portion 104, the floating gate of floating gate transistor 88 comprises a polysilicon portion 106, and the floating gate of floating gate transistor 92 comprises a polysilicon portion 108. A polysilicon portion 109 shows the floating gate of the floating gate transistor of the memory cell adjacent to memory cell 76 that is not shown in FIG. 3. The regions between the word lines and polysilicon portions in the active regions comprise source/drain regions. For example, region 81, which is adjacent to word line WL1 and in active region 61, is the source of select transistor 80, and region 83, which is between word line WL1 and polysilicon portion 102 and in active region 61, is the drain of select transistor 80 and the source of floating gate transistor 78. Similarly contact 94, which is between polysilicon portion 102 and word line WL2 and in active region 61, contacts the drain of transistor 86 and the drain of floating gate transistor 78. Bit line 62 is not shown in FIG. 4, but, as shown in FIG. 3, it contacts contact 94. Similarly contacts 96 and 98 as shown in FIG. 4 contact bit line 64.

A benefit of the architecture of memory array 60 is shown by polysilicon portions 102 and 106 of one column not lining up with the polysilicon portions 104, 108, and 109. This means that active regions 61 and 63 can be closer together than the limitation caused by poly-to-poly spacing. Polysilicon portions 102, 104, 106, 108, and 109 can be extended on their same line but will not intersect. Polysilicon portions 102, 104, 106, 108, and 109 are shown with such extensions 110, 112, 114, 116, and 118, respectively. These extensions do not intersect. In fact these extensions or the polysilicon portions themselves, if made to include the extensions overlap rather than intersect. The extension do not intersect but a perpendicular axis through extension 110 of polysilicon portion 102, which is the floating gate of floating gate transistor 78, intersects extension 114. The floating gates in one column align to contacts in the adjacent column as shown by polysilicon portion 108 laterally aligning to contact 94. The distance between active regions is shown as distance 100, which is the minimum distance that active regions can be in proximity to each other. Thus, the limitation is no longer the poly-to-poly spacing of polysilicon portions of floating gate transistors that line up with one another but by the minimum active-region spacing. This reduces the size of array 60 as compared to array 10.

Figure 5:
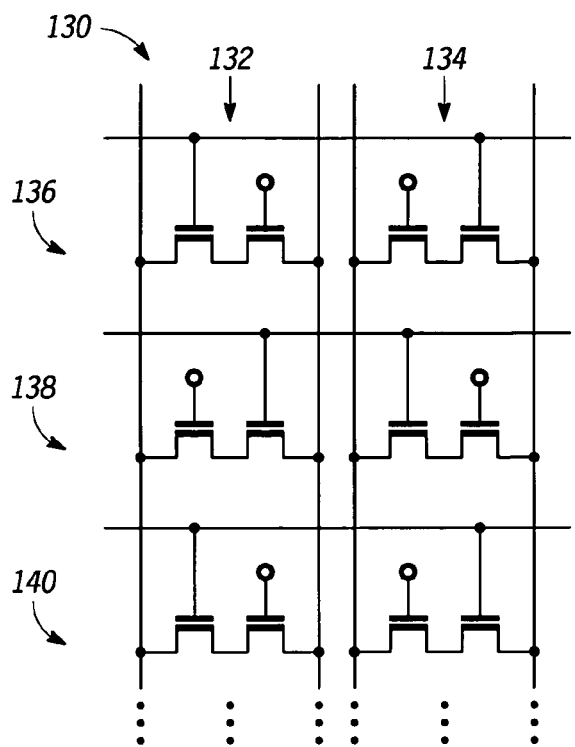
FIG. 5 is a circuit diagram of an NVM array according to an alternative embodiment.

Shown in FIG. 5 is an array 130 comprising memory cells like those of array 60 and comprising rows 136, 138, and 140 and columns 132 and 134. In this case not only does the configuration of the adjacent memory cells in the same column differ, but the configuration of adjacent memory cells in the same row differ.

Figure 6:
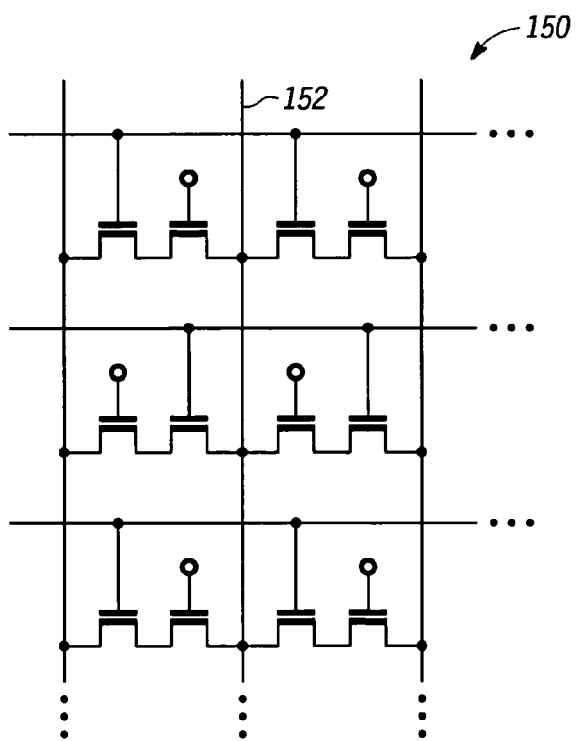
FIG. 6 is a circuit diagram of an NVM array according to yet another embodiment.

Shown in FIG. 6 is an array 150 similar to array 60 except that the bit lines between adjacent columns have been merged into a single bit line 152. Thus, instead of separate bit lines 64 and 66 between the columns, there is a single bit line 152. This can apply to array 130 as well. In such case instead of two bit lines between columns 132 and 134, these two columns would share a single bit line such as bit line 152.

Various changes and modifications to the embodiments herein chosen for purposes of illustration will readily occur to those skilled in the art. For example, memory arrays with a small number of rows and columns are shown but memory array with many more rows and columns are achievable. The transistors were shown as N channel transistors but P channel transistors may also be used in some applications. The storage material for the floating gate transistors was described as polysilicon but another material may be useful in some applications. To the extent that such modifications and variations do not depart from the spirit of the invention, they are intended to be included within the scope thereof which is assessed only by a fair interpretation of the following claims.

What is claimed is:

1. A nonvolatile memory array comprising:
a plurality of memory cells arranged in rows and columns, each row comprising a corresponding one of a plurality of word lines and each column comprising two of a plurality of bit lines, each memory cell comprising:
a select transistor having a first current electrode, a control electrode connected to a predetermined one of the plurality of word lines corresponding to a respective row and a second current electrode connected to a predetermined first of the two of the plurality of bit lines corresponding to a respective column; and
a floating gate transistor having a first current electrode connected to the first current electrode of the select transistor, a floating gate, and a second current electrode connected to a predetermined second of the two of the plurality of bit lines corresponding to the respective column;
the second current electrode of the select transistor of a first memory cell and the second current electrode of the floating gate transistor of a second memory cell in an adjacent column cell location of a same column are directly connected to a same bit line.

2. The nonvolatile memory array of claim 1 wherein the select transistor and the floating gate transistor of adjoining memory cells in a row having a substantially same physical layout.

3. The nonvolatile memory array of claim 1 wherein the select transistor and the floating gate transistor of adjoining memory cells in a column have a substantially mirrored physical layout.

4. The nonvolatile memory array of claim 1 wherein the floating gate of the floating gate transistor of the first memory cell is not laterally aligned with a floating gate of a floating gate transistor of a third memory cell which is adjacent the first memory cell in a same row, and a separation distance between adjacent columns is reduced.

5. The nonvolatile memory array of claim 4 wherein a perpendicular axis through an edge of the floating gate of the floating gate transistor of the first memory cell intersects the floating gate of the floating gate transistor of the third memory cell wherein the floating gate of the floating gate transistor of the first memory cell laterally overlaps but does not physically contact the floating gate of the floating gate transistor of the third memory cell.

6. The nonvolatile memory array of claim 1 wherein the floating gate of the floating gate transistor of the first memory cell is at least partially laterally aligned with at least a portion of a contact to a bit line of a third memory cell which is adjacent the first memory cell in a same row, wherein a select transistor of the third memory cell is connected to said contact to the bit line of the third memory cell.

7. The nonvolatile memory array of claim 1 further comprising:
a third memory cell which is adjacent the first memory cell in a same row and an adjacent column and coupled to a third bit line and a fourth bit line, the third bit line being closer to the first memory cell than the fourth bit line, the third memory cell comprising a respective select transistor having a current electrode directly connected to the third bit line and a respective floating gate transistor having a current electrode directly connected to the fourth bit line.

8. The nonvolatile memory array of claim 1 further comprising:
a third memory cell which is adjacent the first memory cell in a same row and an adjacent column and coupled to a third bit line and a fourth bit line, the third bit line being closer to the first memory cell than the fourth bit line, the third memory cell comprising a respective floating gate transistor having a current electrode directly connected to the third bit line and a respective select transistor having a current electrode directly connected to the fourth bit line.

9. The nonvolatile memory array of claim 1 wherein each column of the plurality of memory cells comprises two of the plurality of bit lines by sharing a common bit line with each adjoining column.

10. A nonvolatile memory array having a plurality of memory cells arranged in rows and columns, comprising:
a first continuous active area defining a first column;
a second continuous active area defining a second column and separated from the first continuous active area by a separation area of a predetermined minimum distance;

a first word line orthogonal to and above the first continuous active area and the second continuous active area and within a first row;

a second word line orthogonal to and above the first continuous active area and the second continuous active area and within a second row;

a first memory cell formed overlying the first continuous active area and having a first floating gate electrode on a first side of the first word line; and a second memory cell laterally adjacent the first memory cell within the first row and formed overlying the second continuous active area and having a second floating gate electrode positioned on an opposing side of the first word line than the first floating gate electrode;

wherein each of the first floating gate electrode and the second floating gate electrode extend laterally into the separation area by a distance greater than fifty percent of the separation area and without touching.

11. The nonvolatile memory array of claim 10 further comprising:

a first contact structure in the second memory cell in the second area and on the first side of the first word line; and a second contact structure in the first memory cell in the first area and on the second side of the first word line.

12. A method of providing a nonvolatile memory array having a plurality of memory cells arranged in rows and columns, comprising:

providing two bit lines per column;

providing a select transistor in each memory cell, the select transistor having a first current electrode, a control electrode connected to a predetermined one of the plurality of word lines corresponding to a respective row, and a second current electrode connected to a predetermined first of the two of the plurality of bit lines corresponding to a respective column;

providing a floating gate transistor in each memory cell, the floating gate transistor having a first current electrode connected to the first current electrode of the select transistor, a floating gate, and a second current electrode connected to a predetermined second of the two of the plurality of bit lines corresponding to the respective column; and directly connecting the second current electrode of the select transistor of a first memory cell and the second current electrode of the floating gate transistor of a second memory cell in an adjacent column cell location of a same column to a same bit line.

13. The method of claim 12 further comprising:

forming the select transistor and the floating gate transistor of adjoining memory cells in a row with a substantially same physical layout.

14. The method of claim 12 further comprising:

wherein the select transistor and the floating gate transistor of adjoining memory cells in a column have a substantially mirrored physical layout.

15. The method of claim 12 further comprising:

laterally misaligning the floating gate of the floating gate transistor of the first memory cell with a floating gate of a floating gate transistor of a third memory cell which is adjacent the first memory cell in an adjacent row, the misaligning allowing reduction of a separation distance between adjacent columns.

16. The method of claim 15 further comprising extending the floating gate of the floating gate transistor of the first memory cell and the floating gate of the floating gate transistor of the third memory cell into the separation distance.

17. The method of claim 12 further comprising:

partially laterally aligning the floating gate of the floating gate transistor of the first memory cell with at least a portion of a contact to a bit line of a third memory cell which is adjacent the first memory cell in an adjacent row.

18. The method of claim 12 further comprising:

providing a third memory cell adjacent to the first memory cell in a same row and an adjacent column and coupled to a third bit line and a fourth bit line, the third bit line being closer to the first memory cell than the fourth bit line, the third memory cell comprising a respective select transistor having a current electrode directly connected to the third bit line and a respective floating gate transistor having a current electrode directly connected to the fourth bit line.

19. The method of claim 12 further comprising:

providing a third memory cell which is adjacent the first memory cell in a same row and an adjacent column and coupled to a third bit line and a fourth bit line, the third bit line being closer to the first memory cell than the fourth bit line, the third memory cell comprising a respective floating gate transistor having a current electrode directly connected to the third bit line and a respective select transistor having a current electrode directly connected to the fourth bit line.

* * * * *